(12) United States Patent
Taylor et al.

(10) Patent No.: US 10,347,479 B2
(45) Date of Patent: Jul. 9, 2019

(54) CIRCUIT FOR GENERATING A VOLTAGE WAVEFORM AT AN OUTPUT NODE

(71) Applicant: SHIMADZU CORPORATION, Nakagyo-ku, Kyoto (JP)

(72) Inventors: Steven Douglas Taylor, Manchester (GB); Stuart John Lawrence Harley, Manchester (GB); John Handford, Manchester (GB)

(73) Assignee: SHIMADZU CORPORATION, Kyoto (JP)

(*) Notice: Subject to any disclaimer, the term of this patent is extended or adjusted under 35 U.S.C. 154(b) by 0 days.

(21) Appl. No.: 15/569,492

(22) PCT Filed: Mar. 24, 2016

(86) PCT No.: PCT/EP2016/056653
§ 371 (c)(1),
(2) Date: Oct. 26, 2017

(87) PCT Pub. No.: WO2016/173786
PCT Pub. Date: Nov. 3, 2016

(65) Prior Publication Data
US 2018/0301327 A1    Oct. 18, 2018

(30) Foreign Application Priority Data
Apr. 30, 2015   (GB) .................................. 1507474.3

(51) Int. Cl.
*H03K 17/00*   (2006.01)
*H01J 49/02*   (2006.01)
(Continued)

(52) U.S. Cl.
CPC ........... *H01J 49/022* (2013.01); *H02M 7/537* (2013.01); *H03K 3/012* (2013.01);
(Continued)

(58) Field of Classification Search
CPC .... H01J 49/022; H03K 3/012; H03K 17/6874
(Continued)

(56) References Cited

U.S. PATENT DOCUMENTS

| 7,755,573 B2* | 7/2010 | Seo ...................... G09G 3/2942 345/60 |
| 2004/0079875 A1* | 4/2004 | Ding ...................... H01J 49/424 250/282 |

(Continued)

FOREIGN PATENT DOCUMENTS

| CN | 1 432 982 A | 7/2003 |
| CN | 104184309 A | 12/2014 |

(Continued)

OTHER PUBLICATIONS

International Search Report for PCT/EP2016/056653 dated Jun. 8, 2016 [PCT/ISA/210].

(Continued)

*Primary Examiner* — Metasebia T Retebo
(74) *Attorney, Agent, or Firm* — Sughrue Mion, PLLC

(57) ABSTRACT

A circuit for generating a voltage waveform at an output node includes a first voltage rail configured to be held at a first voltage, the first voltage rail being connected to the output node via a first voltage rail switch, a second voltage rail configured to be held at a second voltage that is different from the first voltage, the second voltage rail being connected to the output node via a second voltage rail switch, at least one anchor node connected to the output node via an inductor and an anchor node switch, and a control unit configured to switch the circuit between: a first voltage outputting state in which the first voltage rail switch is closed and the second voltage rail switch is open, and a
(Continued)

second voltage outputting producing state in which the second voltage rail switch is closed and the first voltage rail switch is open.

8 Claims, 8 Drawing Sheets

(51) Int. Cl.
*H02M 7/537* (2006.01)
*H03K 3/012* (2006.01)
*H03K 17/687* (2006.01)
*H02M 1/00* (2006.01)
*H02M 7/48* (2007.01)

(52) U.S. Cl.
CPC . *H03K 17/6874* (2013.01); *H02M 2001/0058* (2013.01); *H02M 2007/4815* (2013.01); *Y02B 70/1441* (2013.01); *Y02B 70/1491* (2013.01)

(58) Field of Classification Search
USPC ........................................................ 327/124
See application file for complete search history.

(56) References Cited

U.S. PATENT DOCUMENTS

| | | |
|---|---|---|
| 2006/0038749 A1 | 2/2006 | Lee et al. |
| 2006/0050021 A1 | 3/2006 | Choi |
| 2008/0106499 A1* | 5/2008 | Kim ............... G09G 3/2965 345/60 |
| 2014/0347104 A1 | 11/2014 | Taylor et al. |

FOREIGN PATENT DOCUMENTS

| | | |
|---|---|---|
| EP | 1 635 318 A2 | 3/2006 |
| EP | 1 777 682 A2 | 4/2007 |
| EP | 2 806 553 A2 | 11/2014 |
| JP | 8-512140 A | 12/1996 |
| JP | 2005-514894 A | 5/2005 |
| JP | 2006-58855 A | 3/2006 |
| JP | 2006-79086 A | 3/2006 |
| WO | 01/029875 A2 | 4/2001 |
| WO | 03/058592 A1 | 7/2003 |

OTHER PUBLICATIONS

Written Opinion for PCT/EP2016/056653 dated Jun. 8, 2016 [PCT/ISA/237].

* cited by examiner

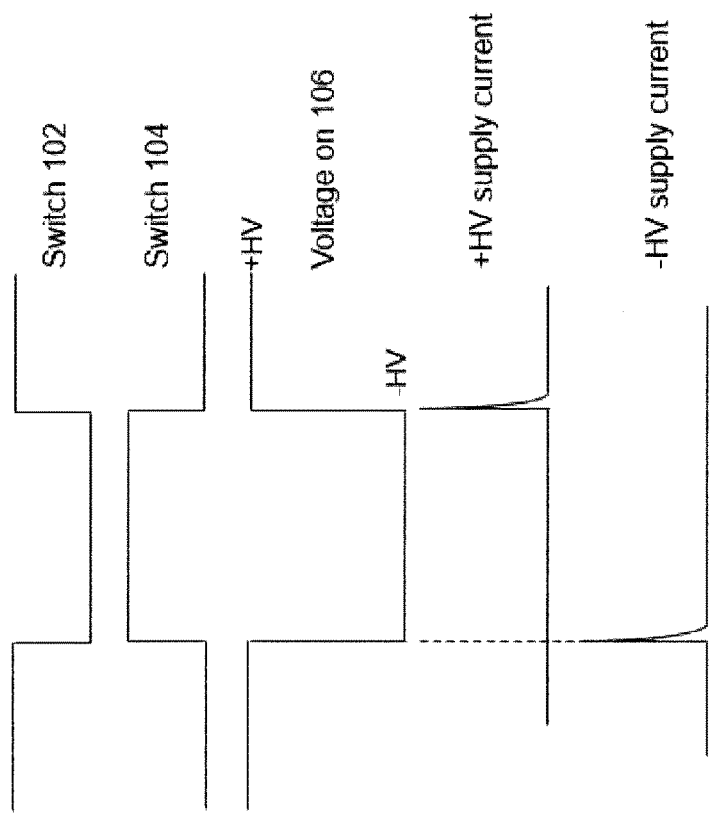
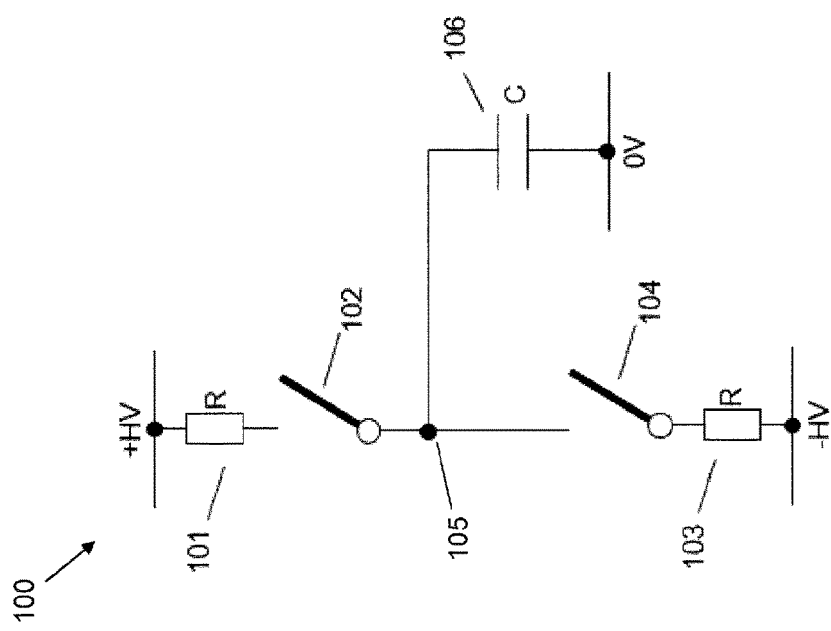
Figure 1

CIRCUIT FOR GENERATING A VOLTAGE WAVEFORM AT AN OUTPUT NODE

CROSS REFERENCE TO RELATED APPLICATIONS

This application is a National Stage of International Application No. PCT/EP2016/056653 filed Mar. 24, 2016, claiming priority based on United Kingdom Patent Application No. 1507474.3 filed Apr. 30, 2015, the contents of all of which are incorporated herein by reference in their entirety.

FIELD OF THE INVENTION

This invention relates to a circuit for generating a voltage waveform at an output node, e.g. for use in a mass spectrometer.

BACKGROUND

As described in a previous patent application by this applicant, EP2806553 (whose disclosure corresponds to that of related applications US2014/0347104 and CN104184309), numerous methods of performing mass spectrometry rely on the application of high frequency voltage waveforms to components of a mass spectrometer. For example, ion optical devices such as ion guides, ion traps, mass filters and other devices may all require such voltage waveforms, as is well described in the literature.

The previous patent application by this applicant, EP2806553, further described that direct switching methods provide a significant advantage over resonant circuits in that the frequency of the voltage waveform can be easily changed during operation. However, "hard switching" techniques (described in more detail below), tend to be inefficient and power consumption is relatively large.

In view of these considerations, EP2806553 proposed various circuits for generating a voltage waveform at an output node in which a control unit was configured to change a voltage at the output node by controlling a voltage rail switch and a bidirectional switch so that, if a load capacitance is connected to the output node, a resonant circuit is established between the inductor and the load capacitance. The circuits proposed by EP2806553 were referred to as "energy recovery" circuits, as they helped the voltage waveform to be generated in a more energy efficient manner.

However, whilst the circuits proposed by EP2806553 provide a significant improvement in energy efficiency compared with "hard switching" techniques in which resonant circuits are not used (e.g. as disclosed in WO01/29875), the present inventors have found that the "energy recovery" circuits proposed in EP2806553 still result in a significant amount of current to be drawn from high voltage power supplies typically used in generating the voltage waveform, which can cause a lack of stability in the voltages provided by the high voltage power supplies (which may be highly problematic in certain applications, such as mass spectrometry). As such, the present inventors believe it would be desirable to further improve such circuits.

The present invention has been devised in light of the above considerations.

SUMMARY OF THE INVENTION

A first aspect of the invention may provide:

A circuit for generating a voltage waveform at an output node, the circuit including:
a first voltage rail configured to be held at a first voltage, wherein the first voltage rail is connected to the output node via a first voltage rail switch;
a second voltage rail configured to be held at a second voltage that is different from the first voltage, wherein the second voltage rail is connected to the output node via a second voltage rail switch;
at least one anchor node connected to the output node via an inductor and an anchor node switch; and
a control unit configured to switch the circuit between:
a first voltage outputting state in which the first voltage rail switch is closed and the second voltage rail switch is open such that the output node is clamped to the first voltage;
a second voltage outputting producing state in which the second voltage rail switch is closed and the first voltage rail switch is open such that the output node is clamped to the second voltage;
wherein the control unit is configured to switch the circuit from the first voltage outputting state to the second voltage outputting state by:
opening the first voltage rail switch and closing an anchor node switch that connects the output node via an inductor to an anchor node held at a first anchor voltage so that, if a load capacitance is connected to the output node, a resonant circuit is established between the inductor and the load capacitance causing the voltage at the output node to swing towards the second voltage, wherein the first anchor voltage is configured to provide energy that assists the voltage at the output node in swinging towards the second voltage; and then
opening the anchor node switch and closing the second voltage rail switch;
wherein the control unit is further configured to switch the circuit from the second voltage outputting state to the first voltage outputting state by:
opening the second voltage rail switch and closing an anchor node switch that connects the output node via an inductor to an anchor node held at a second anchor voltage so that, if a load capacitance is connected to the output node, a resonant circuit is established between the inductor and the load capacitance causing the voltage at the output node to swing towards the first voltage, wherein the second anchor voltage is configured to provide energy that assists the voltage at the output node in swinging towards the first voltage; and then
opening the anchor node switch and closing the first voltage rail switch.

As discussed in more detail below, by using first and second anchor voltages in this way, the voltage at the output node can be assisted to swing closer to (preferably so as to reach) the first/second voltages, thereby causing less current to be drawn from the first and second voltage rails compared with the circuits proposed in EP2806553. This helps to stabilise the first/second voltages, which is particularly useful in applications where these voltages need to be very stable, e.g. mass spectrometry.

A circuit according to the first aspect of the invention may be referred to as a "pre-charge energy recovery" circuit herein. Note that the term "pre-charge energy recovery" is used simply as a label, to distinguish circuits which are according to the first aspect of the invention from other circuits.

Note also that the term "anchor" is used herein simply as a label, e.g. to distinguish an "anchor node" from other nodes (e.g. an "output node"). The reason the term "anchor" has been chosen to label the "anchor node" and associated circuit elements is that the anchor node can be seen as providing an anchor that exerts influence on a resonant circuit if it is connected to such a circuit.

Preferably, the circuit includes voltage rail sources configured to provide the first and second voltages, and one or more anchor voltage sources configured to provide the first and second anchor voltages, wherein the anchor voltage sources are independent from the voltage rail sources. In this way, a reduced amount of current (preferably near zero current) can be drawn from the voltage rail sources, thereby helping to avoid a lack of stability in the first and second voltages provided by the voltage rail sources (this is particularly useful in certain applications where the voltage rail sources are "high voltage" power supplies, e.g. as is the case in mass spectrometry).

Preferably, the first anchor voltage is chosen so that the voltage at the output node swings towards and reaches the second voltage (preferably without swinging substantially past the second voltage), when the control circuit switches the circuit from the first voltage outputting state to the second voltage outputting state. More preferably, the first anchor voltage is chosen so that the voltage at the output node reaches a peak in the voltage swing caused by the established resonant circuit at (or substantially at) the second voltage, when the control circuit switches the circuit from the first voltage outputting state to the second voltage outputting state.

Similarly, the second anchor voltage is preferably chosen so that the voltage at the output node swings towards and reaches the first voltage (preferably without swinging substantially past the first voltage), when the control circuit switches the circuit from the second voltage outputting state to the first voltage outputting state. More preferably, the second anchor voltage is chosen so that the voltage at the output node reaches a peak in the voltage swing caused by the established resonant circuit at (or substantially at) the first voltage, when the control circuit switches the circuit from the second voltage outputting state to the first voltage outputting state.

Preferably, the anchor node held at the first anchor voltage is separate from the anchor node held at the second anchor voltage.

Thus, the anchor node held at the first voltage (during the switching of the circuit from the first voltage outputting state to the second voltage outputting state) may be a first anchor node configured to be held at the first anchor voltage (e.g. by a first anchor voltage source); and the anchor node held at the second voltage (during the switching of the circuit from the second voltage outputting state to the first voltage outputting state) may be a second anchor node configured to be held at the second anchor voltage (e.g. by a second anchor voltage source), the first anchor node being separate from the second anchor node.

In such embodiments, it should be noted that the first and second anchor nodes may be connected to the output node via separate inductors (not shown) or via the same inductor (e.g. as shown in FIG. 4). Similarly, the first and second anchor nodes may be connected to the output node via separate anchor node switches (e.g. as shown in FIG. 4) or by a shared bidirectional anchor node switch (not shown)

Preferably, the first anchor node is connected to the output node via a first anchor node switch that is separate from a second anchor node switch that connects the second anchor node to the output node. In this case, the circuit may include a bidirectional switch via which the first and second anchor nodes connect to the output node (e.g. as shown in FIG. 6).

Note, the first and second anchor node switches do not need to be bidirectional, as current will typically only be drawn one way through such switches.

In some embodiments, the anchor node held at the first voltage (during the switching of the circuit from the first voltage outputting state to the second voltage outputting state) may be the same anchor node as the anchor node held at the second voltage (during the switching of the circuit from the second voltage outputting state to the first voltage outputting state).

In such embodiments, the control unit may be configured to hold the one anchor node at the first anchor voltage during the switching of the circuit from the first voltage outputting state to the second voltage outputting state, and to hold the one anchor node at the second anchor voltage during the switching of the circuit from the second voltage outputting state to the first voltage outputting state. This could be achieved, for example, by having a dynamically variable voltage source connected to the one anchor node (not shown).

Herein, unless otherwise stated, a switch could be a unidirectional switch (capable of allowing current to flow through the switch in one direction) or a bidirectional switch (capable of allowing current to flow through the switch in two directions).

A unidirectional switch may include a MOSFET or a bipolar junction transistor, for example.

In general, a bidirectional switch is only needed when it needs to allow current to pass in both directions (e.g. as is the case for switch 408c in FIG. 6).

A bidirectional switch may include two or more transistors connected in series, e.g. as described in EP2806553. Thus, preferably, the two or more transistors connected in series include a pair of transistors connected back-to-back, i.e. so that the direction of conventional current flow associated with the pair of transistors point in opposite directions. For example, a pair of MOSFETs connected back-to-back could have their sources connected together or their drains connected together. For example, a pair of npn transistors or a pair of pnp transistors could have their collectors connected together or their emitters connected together.

The two or more transistors connected in series (in the/each bidirectional switch) may include a pair of MOSFET transistors, e.g. as described in EP2806553.

Preferably, both the first and second voltage have a magnitude that is at least 10V, more preferably at least 50V, more preferably at least 100V, more preferably at least 500V, more preferably at least 1000V, with respect to a ground (the ground may be between the first anchor voltage and the second anchor voltage).

Both the first and second voltage may have a magnitude that is between 10V and 30,000V, between 50V and 2500V, or between 100V and 1000V with respect to a ground (the ground may be between the first anchor voltage and the second anchor voltage).

Preferably, both the first and second voltage have a magnitude that is variable up to 100V or higher, more preferably 500V or higher, more preferably 1000V or higher with respect to a ground (the ground may be between the first anchor voltage and the second anchor voltage).

The first and second anchor voltage may have a magnitude that is less than 1000V, more preferably less than 500V with respect to a ground (the ground may be between the first anchor voltage and the second anchor voltage).

The first voltage and second voltage preferably have a magnitude that is substantially equal to and opposite in polarity to the other of the first and second voltage with respect to a ground (the ground may be between the first anchor voltage and the second anchor voltage) so as to ensure that the established resonant circuits works effectively.

Preferably, the circuit is a switching circuit for generating a switching voltage waveform that switches between the first voltage and the second voltage, preferably at a frequency that is between 1 Hz and 10 MHz, more preferably between 10 Hz and 1 MHz.

Preferably, the control unit is configured to change the frequency at which the switching voltage waveform switches between the first voltage and the second voltage, preferably up to a frequency that is 10 kHz or higher, more preferably 100 kHz or higher, more preferably 1 MHz or higher.

Herein, a "resonant circuit" established between an inductor and a capacitor may be understood as a circuit in which the inductor and capacitor are connected together, preferably whilst being disconnected from the first and second voltage rails noted above. The "resonant circuit" may also include, for example, an anchor node connected to the output node via an inductor and a bidirectional switch. As is well known in the art, electrical energy stored in a resonant circuit will have a tendency to oscillate between inductive and capacitive elements at a resonant frequency. For the avoidance of any doubt, a "resonant circuit" can be viewed as having been established even if electrical energy within the resonant circuit does not complete a full cycle of oscillation before a different circuit is established (e.g. because the resonant circuit has been broken before a full cycle of oscillation has been completed).

Preferably, opening the anchor node switch and closing the second voltage switch (during the switching of the circuit from the first voltage outputting state to the second voltage outputting state) is performed when the voltage at the output node is at or near to (e.g. within 10% of, more preferably within 1% of) the second voltage. As can be seen from the discussion below, this helps the voltage at the output node to be changed in a particularly efficient manner, since less current can be drawn from the second voltage rail.

Note that the anchor node switch is preferably opened before closing the second voltage switch, so as to maximise efficiency. The time gap between opening the anchor node switch and closing the second voltage switch is preferably very small, e.g. 100 ns or less.

Similarly, preferably, opening the anchor node switch and closing the first voltage switch (during the switching of the circuit from the second voltage outputting state to the first voltage outputting state) is performed when the voltage at the output node is at or near to (e.g. within 10% of, more preferably within 1% of) the first voltage. As can be seen from the discussion below, this helps the voltage at the output node to be changed in a particularly efficient manner, since less current can be drawn from the first voltage rail.

Again, note that the anchor node switch is preferably opened before closing the first voltage switch, so as to maximise efficiency. Again, the time gap between opening the anchor node switch and closing the first voltage switch is preferably very small, e.g. 100 ns or less.

Of course, the control unit may be configured to switch the circuit from the first voltage outputting state to the second voltage outputting state (and vice versa) at any predetermined frequency, so as to achieve a desired frequency of the voltage waveform.

Preferably, the first and second anchor voltages are between the first and second voltages, with the first anchor voltage being closer to the second voltage than the first voltage, and with the second anchor voltage being closer to the first voltage than the second voltage. This helps the anchor node(s) provide energy to assist the voltage at the output node swing in the manner described above.

The circuit may include a load capacitance connected to the output node (e.g. as shown in FIG. 4).

The circuit (including the load capacitance, if present) may be included in an apparatus for use in processing charged particles, e.g. for use in performing mass spectrometry or ion mobility spectrometry. The circuit is thought to be particularly well suited for use in polarity switching in mass spectrometry.

The control unit may, for example, be a computer. However, this is not a requirement since, for example, the control unit may include suitable logic elements (e.g. with appropriate delay elements such as monostables).

The second aspect of the invention may provide an apparatus for use in processing charged particles that includes a circuit according to the first aspect of the invention.

For example, the second aspect of the invention may provide:

An apparatus for use in processing charged particles, the apparatus including:
a circuit according to the first aspect of the invention;
wherein the circuit includes a load capacitance connected to the output node, e.g. so that, in use, the load capacitance receives a voltage waveform generated at the output node by the circuit.

The load capacitance may be or form part of any component(s) suitable for use in processing charged particles, e.g. for use in performing mass spectrometry or ion mobility spectrometry. For example the load capacitance may be or form part of:
an ion optical device for altering or containing a flight path of ions; and/or
a mass filter; and/or
an ion trap; and/or
an ion transfer device; and/or
an ion mobility device.

Preferably, the load capacitance is or forms part of an ion optical device for altering or containing a flight path of ions.

The load capacitance may include a plurality of (e.g. two) electrodes.

Preferably the two electrodes are formed from rods or plates and are preferably configured such that they are disposed around an ion optical axis. Any number of rods/plates may be used. The rods may have hyperbolic shaped faces.

The apparatus may be a mass spectrometer.

The mass spectrometer may also include:
an ion source configured to produce ions;
an ion processing region configured to process ions;
a mass analyser configured to separate the ions according to their mass/charge ratio;
a detector configured to detect the separated ions. In this case, the apparatus may be viewed as a mass spectrometer.

The load capacitance may be included in the ion source and/or the ion processing region and/or the mass analyser and/or the detector, for example.

A third aspect of the invention may also provide a method of controlling a circuit or apparatus according to any previous aspect of the invention.

The method may include any method step corresponding to an operation described in relation to any previous aspect of the invention.

The method may be a method of processing charged particles, e.g. for use in performing mass spectrometry or ion mobility spectrometry.

A fourth aspect of the invention may provide a computer-readable medium having computer-executable instructions configured to control a circuit according to any aspect of the invention to perform a method according to any aspect of the invention. However, control schemes other than computer control could be implemented (e.g. discrete logic with clocked or analogue timing elements).

A fifth aspect of the invention may provide a method of modifying a circuit for generating a voltage waveform at an output node to provide a circuit according to the first aspect of the present invention. The modified circuit may be referred to as a "retrofitted" circuit.

The invention also includes any combination of the aspects and preferred features described except where such a combination is clearly impermissible or expressly avoided.

BRIEF DESCRIPTION OF THE DRAWINGS

Examples of these proposals are discussed below, with reference to the accompanying drawings in which:

FIG. 1 shows a circuit diagram of a "hard switching" circuit (which may also be referred to as a "basic polarity switch") and a corresponding mode of operation that is not an embodiment of the present invention, but is useful for understanding the present invention.

DETAILED DESCRIPTION

Figure 2:
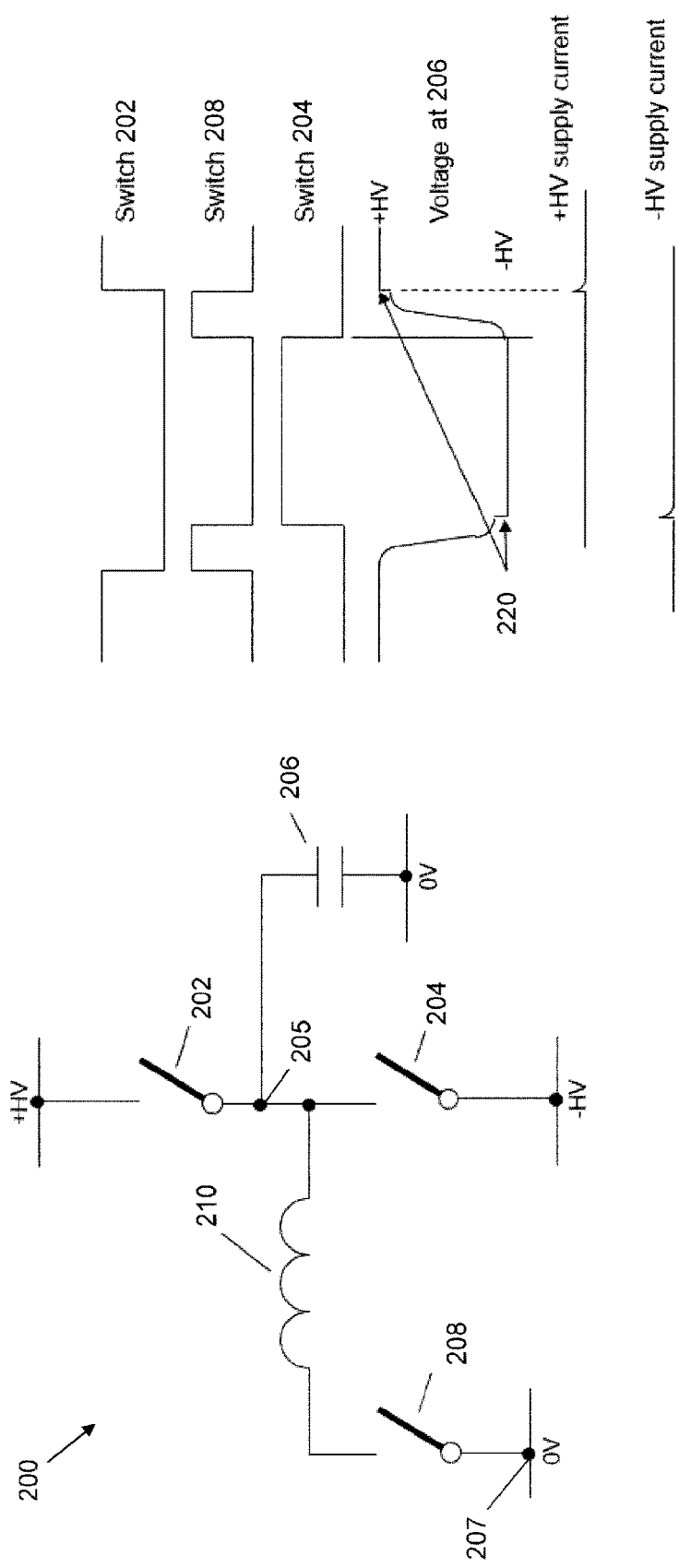
FIG. 2 shows a circuit diagram of an "energy recovery" circuit (which may be referred to as an "energy recovery polarity switch") and a corresponding mode of operation that is not an embodiment of the present invention, but is useful for understanding the present invention.

Polarity switching is an important feature of all types of ToF mass spectrometers and is particularly suited to Ion Trap ToF mass spectrometers. Faster switching improves throughput, duty cycle and sensitivity. In simple terms the higher the rate of switching, the better the overall performance. A problem throughout the industry is that conventionally a high rate of switching is a very difficult objective to meet for reasons outlined below.

Herein, the term "high voltage" (or simply "HV") may be used to refer to a voltage that has a magnitude that is at least 100V, more preferably at least 1000V, with respect to a ground that may be between the first anchor voltage and the second anchor voltage. Similarly, a "high voltage" power supply may be used to refer to a voltage source that is capable of generating a voltage that has a magnitude that is at least 100V, more preferably at least 1000V, with respect to a ground that may be between the first anchor voltage and the second anchor voltage.

Note that in the discussion of the following circuits, the term "hard switching", "energy recovery" and "pre-charge energy recovery" are intended merely as labels to distinguish between different circuits.

FIG. 1 illustrates a "hard switching" circuit 100 that implements a form of conventional polarity switching, which is referred to herein as a "hard switching" technique, since it does not involve establishing a resonant circuit.

In the "hard switching" circuit 100 of FIG. 1, a first voltage rail held at a first voltage (+HV) by a first high voltage power supply (not shown) is connected to an output node 105 via a first voltage rail switch 102, and a second voltage rail held at a second voltage (−HV) by a second high voltage power supply (not shown) is connected to the output node 105 via a second voltage rail switch 104.

Assume that the first voltage rail switch 102 is closed and the second voltage rail switch 104 is open. The voltage at a load capacitance 106 connected to the output node 105 is therefore that of the first voltage rail (+HV). When the first voltage rail switch 102 opens and the second voltage rail switch 104 closes (at time t=0), the voltage at the load capacitance 106 connected to the output node 105 begins to change from +HV to −HV, and a current, i, is drawn from the −HV supply as defined by the equation, $i=V(\exp(-t/CR)/R$ where V is the difference between +HV and −HV, t is time, C is the load capacitance and R is the series resistance.

At time t=0, the current is at its maximum, $i=V/R$. In mass spectrometry where high voltage power supplies may be used to provide the first and second voltages, this drawing of current would for most HV power supplies cause a significant dip in output voltage from which the power supply may take time (e.g. 300 ms) to recover. Typically, mass spectrometry analysis is done after each voltage transition has stabilised and therefore long recovery times can significantly delay the acquisition of mass spectrum data. Since polarity is often switched hundreds of times to compile a single data set this can severely affect data throughput.

A previous patent application by this applicant, EP2806553 (whose disclosure corresponds to US2014/0347104 and CN104184309) proposed various "energy recovery" circuits for reducing the power consumed in generating a voltage waveform, e.g. for use in mass spectrometry.

Reference is made to FIG. 2, which illustrates an "energy recovery" circuit 200 implementing the principles described in EP2806553.

The "energy recovery" circuit 200 of FIG. 2 includes a first voltage rail held at a first voltage (+HV) by a first high voltage power supply (not shown), wherein the first voltage rail is connected to an output node 205 via a first voltage rail switch 202; a second voltage rail held at a second voltage (−HV) by a second high voltage power supply (not shown), wherein the second voltage rail is connected to the output node 205 via a second voltage rail switch 204; and an anchor node 207 connected to the output node 206 via an inductor 210 and a bidirectional switch 208.

In FIG. 2 (and indeed in FIG. 4 and FIG. 6), all of the switches shown can be either solid state, e.g. MOSFETs, bipolar junction transistors or similar semiconductor devices or electromechanical i.e. relays or switches with moving contacts. Switch operation is defined by the waveforms shown on the right of this drawing where a high level denotes a switch in its ON (closed) state and a low level denotes a switch in its OFF (open) state. Note that in the circuit 200 of FIG. 2, the switch 208 must be bidirectional, but the first and second voltage rail switches 202 and 204 can be either bidirectional or unidirectional.

In a first voltage outputting state of the circuit 200, the first voltage rail switch 202 is closed and all other switches open. The voltage at the load capacitance 206 is therefore clamped at +HV in this first voltage outputting state. In operation, the first voltage rail switch 202 opens and the bidirectional switch 208 closes to establish a resonant circuit where energy is transferred from the load capacitance 206 to the inductor 210 causing the voltage at the load capacitance 206 to swing from +HV to 0V. With the bidirectional switch 208 still closed the voltage at the load capacitance 206 continues to swing from zero towards −HV, and energy is transferred back from the inductor 210 to the load capacitance 206. As the voltage on the load capacitance 206 reaches a negative peak, the bidirectional switch 208 opens and the resonant circuit is broken. Timing is critical in this process since, in order to achieve maximum efficiency, it is important for the voltage waveform at the load capacitance 206 to reach a peak amplitude at just the moment that the resonant circuit is broken. The second voltage rail switch 204 then closes to put the circuit 200 in a second voltage outputting state in which the second voltage rail switch 204 is closed and all other switches open. The voltage at the load capacitance 206 is clamped at −HV in this second voltage outputting state.

Thus, the "energy recovery" circuit 200 of FIG. 2 uses the principle of resonance to transfer stored energy in the load capacitance 206 to an inductor 210 and back into the load capacitance 206 as it changes polarity. In this way the inductor 210 supplies almost all of the current to the load capacitance 206 and very little current is therefore taken from the HV power supplies used to provide the first and second voltages to the first and second voltage rails. Indeed, the "energy recovery" circuit 200 of FIG. 2 has been found to achieve a reduction in current drawn from the HV supplies by a factor of ~20, compared with the "hard switching" circuit 100 depicted in FIG. 1, and is therefore well suited for use in high frequency polarity switching.

However, in relation to the operation of the circuit 200 described above, the present inventors have observed that, due to resistive losses in the switches 202, 204, 208 and the inductor 210, the voltage at the load capacitance 206 does not swing in a manner that fully reaches the second voltage (−HV) at which the second voltage rail is held. Rather, the voltage at the load capacitance 206 swings just short of this voltage, which results in a small voltage step 220, as shown in the switching curve of FIG. 3. As illustrated by the right-hand side of FIG. 2, a small voltage step 220 occurs each time the circuit is switched from the first voltage outputting state to the second voltage outputting state (and vice versa).

The voltage steps 220 create small spikes in current drawn from the HV power supplies that provide the first and second voltages (+HV, −HV) to the first and second voltage rails, and although these voltage steps 220 are much smaller than the voltage steps occurring with the "hard switching" circuit 100 depicted in FIG. 1, they have nonetheless been found to cause significant disturbance to the HV power supplies used to provide the first and second voltages (+HV, −HV) to the first and second voltage rails. Similar spikes occur for the transition from the second outputting state to the first outputting state.

That is, whilst the "energy recovery" circuit 200 of FIG. 2 helps to achieve a reduction in the current drawn from the HV power supplies, a small but significant current was nonetheless found to be drawn from the HV power supplies used to hold the first and second voltage rails at the first and second voltages, thereby destabilising the first and second voltages provided by these HV power supplies.

In the examples discussed below, a change that the inventors refer to as "pre-charge" is made compared with the "energy recovery" circuits proposed in EP2806553 to provide "pre-charge energy recovery" circuits that further reduce the current drawn from the HV supplies used to provide the first and second voltages (+HV, −HV) to the first and second voltage rails.

Thus, the "pre-charge energy recovery" circuits discussed below help to address a shortfall in the "energy recovery" circuit 200 of FIG. 2. In theory, the "pre-charge energy recovery" circuits discussed below could reduce the current drawn from the HV power supplies down to zero, but in practice, there are still very small losses in the system meaning that a very small current is drawn from the HV power supplies.

Nonetheless, the "pre-charge energy recovery" circuits discussed below have been found to reduce the current drawn from the HV power supplies by a factor of ~750 compared with the "hard switching" circuit 100 of FIG. 1, and by a factor of ~37 compared with the "energy recovery" circuit 200 of FIG. 2, making the "pre-charge energy recovery" circuits discussed below even more preferable for use in polarity switching applications, especially for applications where stable first and second voltages are desirable, e.g. mass spectrometry.

Figure 4:
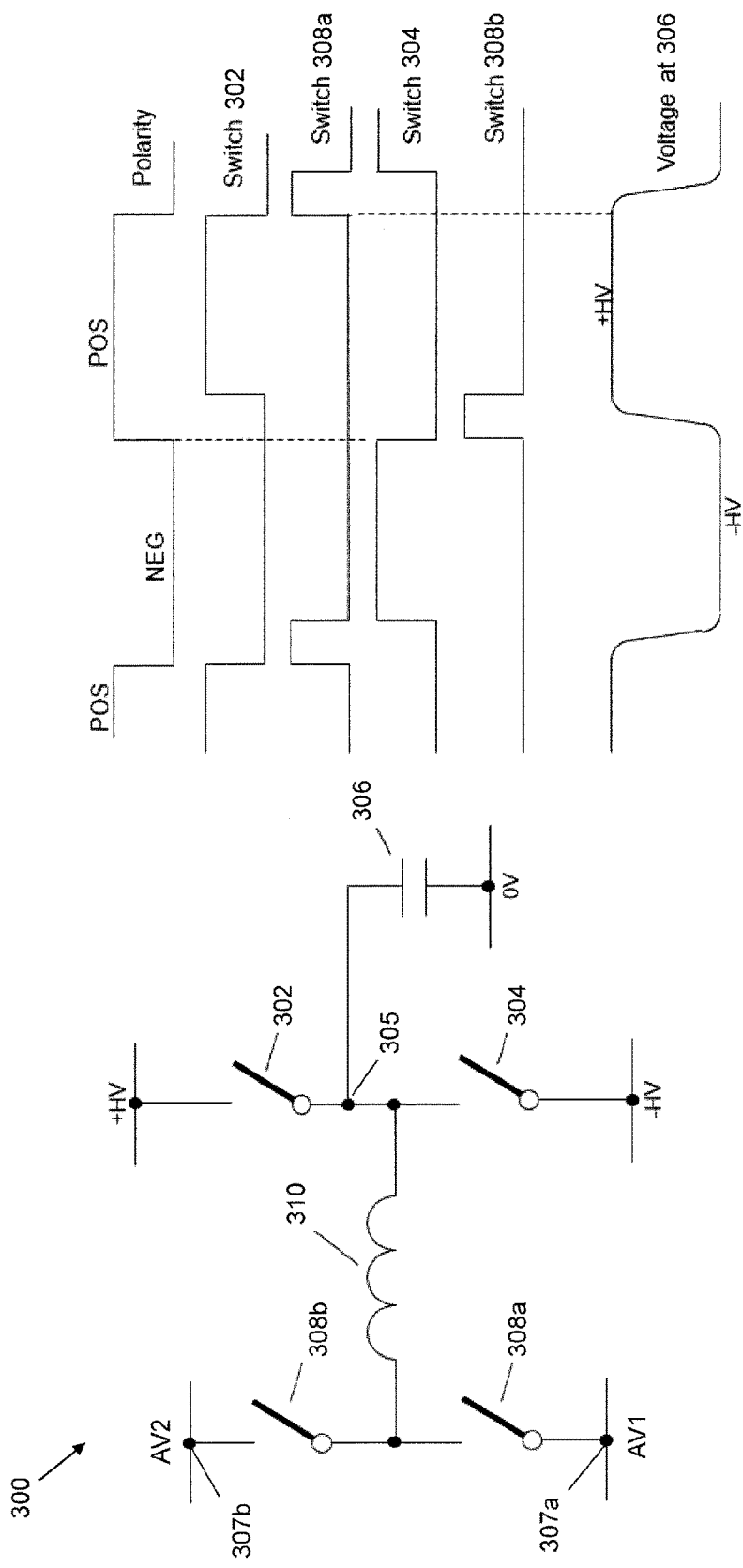
FIG. 4 shows a circuit diagram of a "pre-charge energy recovery" circuit (which may be referred to as an "energy recovery polarity switch") according to a first embodiment of the present invention and a corresponding mode of operation.

Reference is now made to the "pre-charge energy recovery" circuit 300 of FIG. 4, which includes a first voltage rail held at a first voltage (+HV) by a first high voltage power supply (not shown), wherein the first voltage rail is connected to an output node 305 via a first voltage rail switch 302; a second voltage rail held at a second voltage (−HV) by a second high voltage power supply (not shown), wherein the second voltage rail is connected to the output node 305 via a second voltage rail switch 304.

The circuit 300 of FIG. 4 also includes a first anchor node 307a held at a first anchor voltage (AV1) by a first anchor voltage source (not shown) and a second anchor node 307b held at a second anchor voltage (AV2) by a second anchor voltage source (not shown). The first anchor node 307a is connected to the output node 305 via a first anchor node switch 308a and an inductor 310. The second anchor node 307b is connected to the output node 305 via a second anchor node switch 308b and the inductor 310.

The circuit 300 is switchable between:
a first voltage outputting state in which the first voltage rail switch 302 is closed and the second voltage rail switch 304 is open such that the output node 305 is clamped to the first voltage (+NV);
a second voltage outputting producing state in which the second voltage rail switch 304 is closed and the first voltage rail switch 302 is open such that the output node is clamped to the second voltage (−HV).

In general terms, the "pre-charge energy recovery" circuits proposed herein work by adding a small amount of alternating bias to the inductor 310, 410.

For the circuit 300 of FIG. 4, this is achieved by the addition of first and second anchor node switches 308a, 308b and the first and second anchor nodes 307a, 307b held at the first and second anchor voltages (AV1, AV2), e.g. by first and second anchor voltage sources.

As indicated by the switching sequence shown on the right-hand side of FIG. 4, the circuit 300 of FIG. 4 is switched from the first voltage outputting state to the second voltage outputting state (e.g. under the control of an appropriately configured/sequenced control unit, not shown) by opening the first voltage rail switch 302 and closing the first anchor node switch 308a that connects the output node 305 via the inductor 310 to the first anchor node 307a held at the first anchor voltage (AV1) so that a resonant circuit is established between the inductor 310 and the load capacitance 306 causing the voltage at the output node 305 to swing towards the second voltage (−HV), and then opening the first anchor node switch 308a and closing the second voltage rail switch 304.

As also indicated by the switching sequence shown on the right-hand side of FIG. 4, the circuit 300 of FIG. 4 is switched from the second voltage outputting state to the first voltage outputting state (e.g. under the control of an appropriately configured/sequenced control unit, not shown) by opening the second voltage rail switch 304 and closing the second anchor node switch 308b that connects the output node 305 via the inductor 310 to the second anchor node 307b held at the second anchor voltage (AV2) so that a resonant circuit is established between the inductor 310 and the load capacitance 306 causing the voltage at the output node 305 to swing towards the first voltage (+HV), and then opening the second anchor node switch 308b and closing the first voltage rail switch 302.

The first and second anchor voltages (AV1, AV2) are chosen to be between the first and second voltages (+HV, −HV), with the first anchor voltage (AV1) being closer to the second voltage (−HV) than the first voltage (+HV), and with the second anchor voltage (AV2) being closer to the first voltage (+HV) than the second voltage (−HV).

Thus, in this example, the first anchor voltage (AV1) may be provided by a negative voltage source, and the second anchor voltage (AV2) may be provided by a positive voltage source.

It follows that, during the switching of the circuit from the first voltage outputting state to the second voltage outputting state (see above), a negative bias (AV1) is applied to the established resonant circuit and the voltage at the output node 305 (and therefore the load capacitance 306) will therefore swing more negative than was described in connection with the circuit 200 FIG. 2.

Similarly, during the switching of the circuit from the second voltage outputting state to the first voltage outputting state (see above), a positive bias (AV2) is applied to the established resonant circuit and the voltage at the output node 305 (and therefore the load capacitance 306) will therefore swing more positive than was described in connection with the circuit 200 of FIG. 2.

Figure 3:
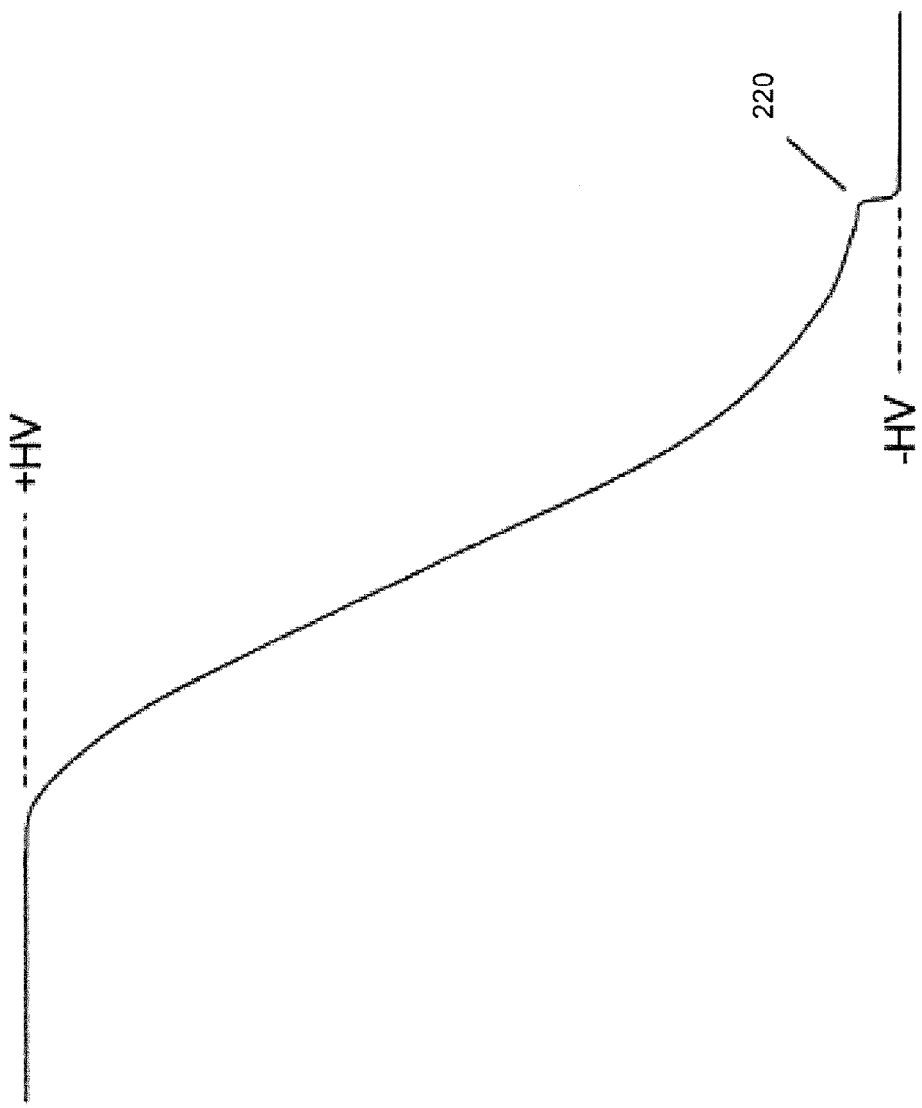
FIG. 3 shows a positive to negative polarity switching curve produced by the "energy recovery" circuit of FIG. 2.

The amplitude of both AV1 and AV2 is preferably adjusted so that the voltage at the output node 305 of FIG. 4 reaches a peak in the voltage swing caused by the established resonant circuit at exactly (or as close to as possible to) −HV (in the case of AV1) and at exactly (or as close to as possible to) +HV (in the case of AV2), i.e. so as to substantially eliminate the voltage steps 220 seen in FIG. 2 and FIG. 3.

Figure 5:
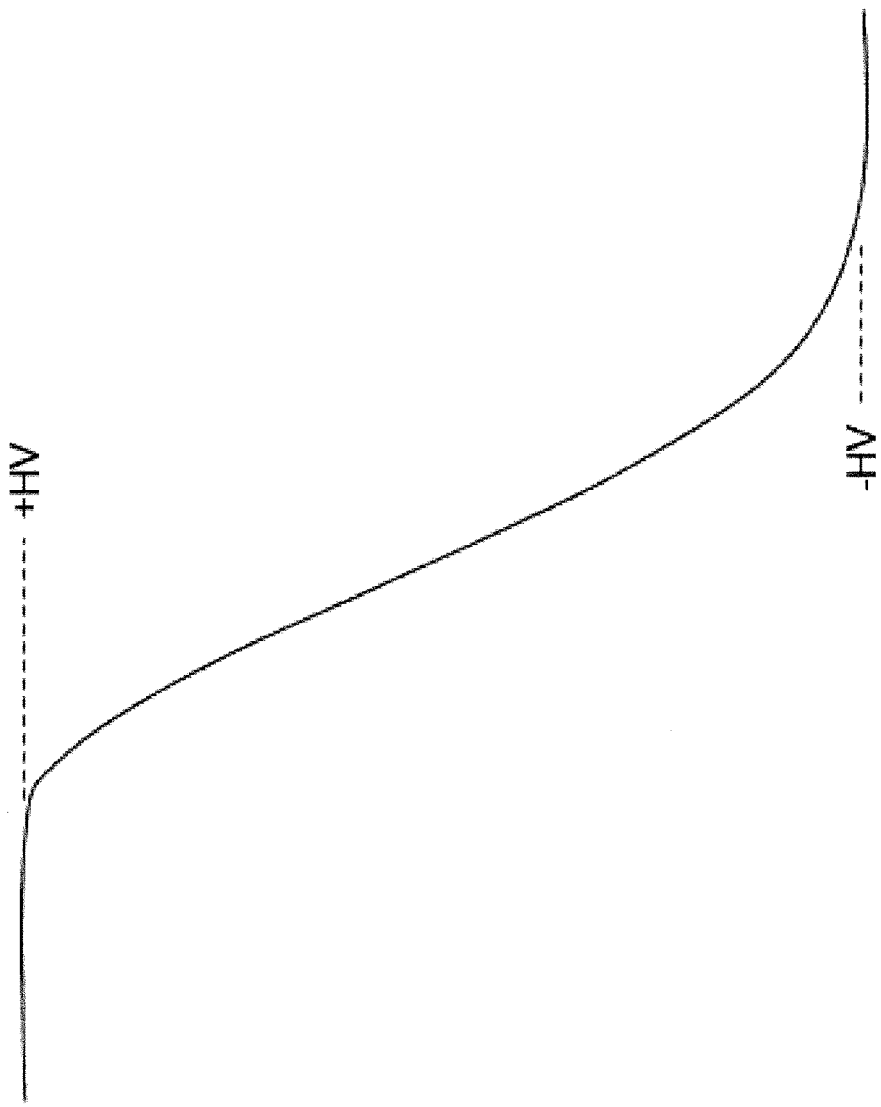
FIG. 5 shows a positive to negative polarity switching curve produced by the "pre-charge energy recovery" circuit of FIG. 4.

As with the circuit 200 of FIG. 2, current is still required to "top-up" the voltage at the load capacitance 306 of FIG. 3, but this current now comes from the voltage sources used to provide the first and second anchor voltages (AV1, AV2). Note that since the first and second anchor voltages are supplied from a voltage source independent from the HV power supplies used to provide the first and second voltages (+HV, −HV) at the first and second voltage rails, the current drawn from the HV supplies drops to near zero. As a consequence the disturbance to the HV supplies becomes insignificant and the settling time of the voltage at the load capacitance 306 is much faster. As well as reducing disturbance on the HV supplies, the output voltage waveform also has a cleaner transition, as can be seen in FIG. 4 and FIG. 5.

As a useful aid to understanding the concept behind the "energy recovery" and "pre-charge energy recovery" circuits discussed above, a mechanical analogy would be a child's swing. If the swing is pulled back and let go it will oscillate back and forth each time reducing in height as air resistance and bearing friction introduce losses. We can maintain full amplitude of oscillation by pulling up on the swing each time it reaches the top of its travel. This would correspond to the "energy recovery" circuit 200 of FIG. 2. Now, if instead of pulling up on the swing another person were to push it at the top of its travel just enough for it to reach the same height, then there is no need to pull up and the swing will maintain its oscillation by pushing alone. If we think of pulling as energy coming from the HV supplies and pushing as coming from the voltage sources that provide AV1 and AV2 then we can see that input energy has simply been shifted from the HV power supplies to the voltage sources that provide AV1 and AV2.

Figure 6:
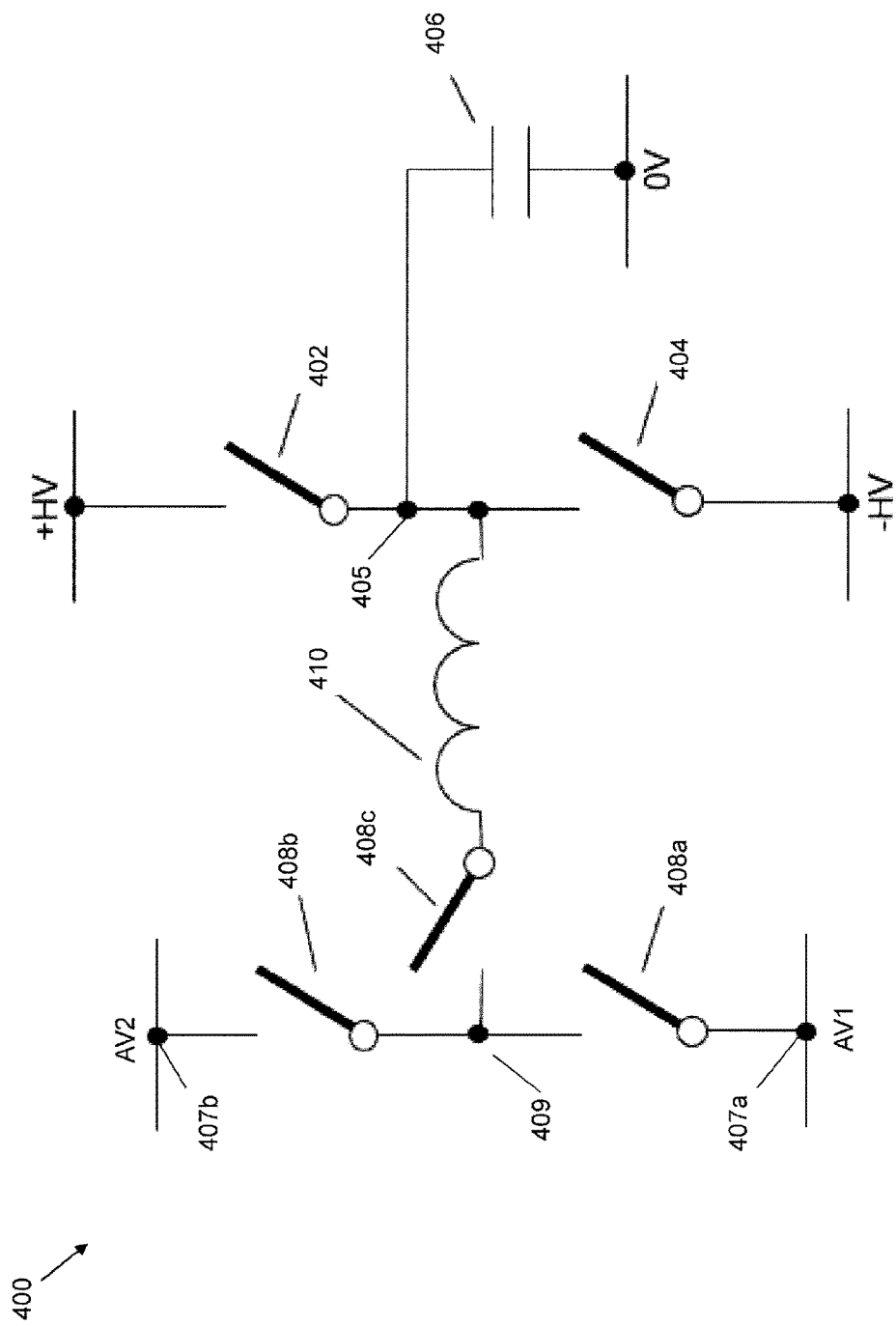
FIG. 6 shows a circuit diagram of a "pre-charge energy recovery" circuit according to a second embodiment of the present invention.

As would be appreciated by a skilled person, various other possible "pre-charge energy recovery" circuits could be envisaged, one of which is shown in FIG. 6. In these drawings, corresponding features have been labelled with corresponding reference numerals and their operation is the same as for the "pre-charge energy recovery" circuit 300 of FIG. 4, unless described otherwise below.

In the alternative "pre-charge energy recovery" circuit 400 of FIG. 6, a bidirectional switch 408c is added to lessen the voltage stress on the anchor node switches 408a, 408b, so that the bidirectional switch handles most of the high voltage from the established resonant circuit.

In use, switches 408a and 408b can operate exactly as described with reference to the circuit 300 of FIG. 4, with the bidirectional switch 408c closing just after the first anchor node switch 408a or second anchor node switch 408b closes, and with the bidirectional switch 408c opening just before the first anchor node switch 408a or second anchor node switch 408b opens. In this way, the bidirectional switch 408c will always be open before the first anchor node switch 408a or second anchor node switch 408b opens, and will remain open until the first anchor node switch 408a or second anchor node switch 408b closes. The bidirectional switch 408c therefore takes the full voltage from the established resonant circuit. This has the advantage of minimising gate drive circuitry.

In tests carried out at SRL, the "energy recovery" circuit 200 of FIG. 2 achieved a reduction in current drawn from the HV supplies by a factor of ~20 compared with the "hard switching" circuit 100 of FIG. 1, and the "pre-charge energy recovery" circuit 300 of FIG. 4 achieved a reduction in current drawn from the HV supplies by a factor of ~750 compared with the "hard switching" circuit 100 of FIG. 1.

Figure 7:
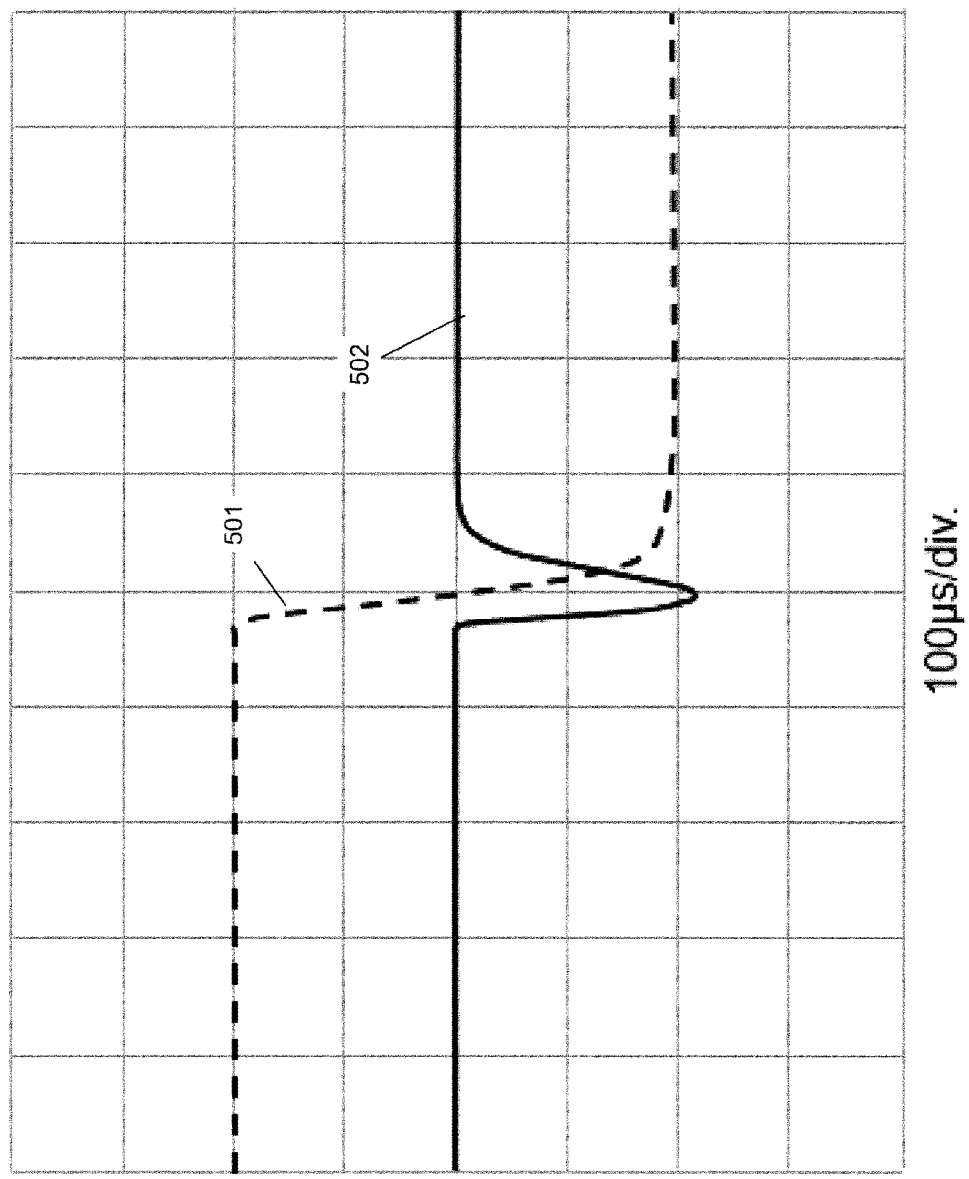
FIG. 7 shows an oscilloscope trace showing the output voltage 501 (dotted line) across a load capacitance and the current drawn from an HV power supply 502 (solid line) obtained using the "hard switching" circuit of FIG. 1.
Figure 8:
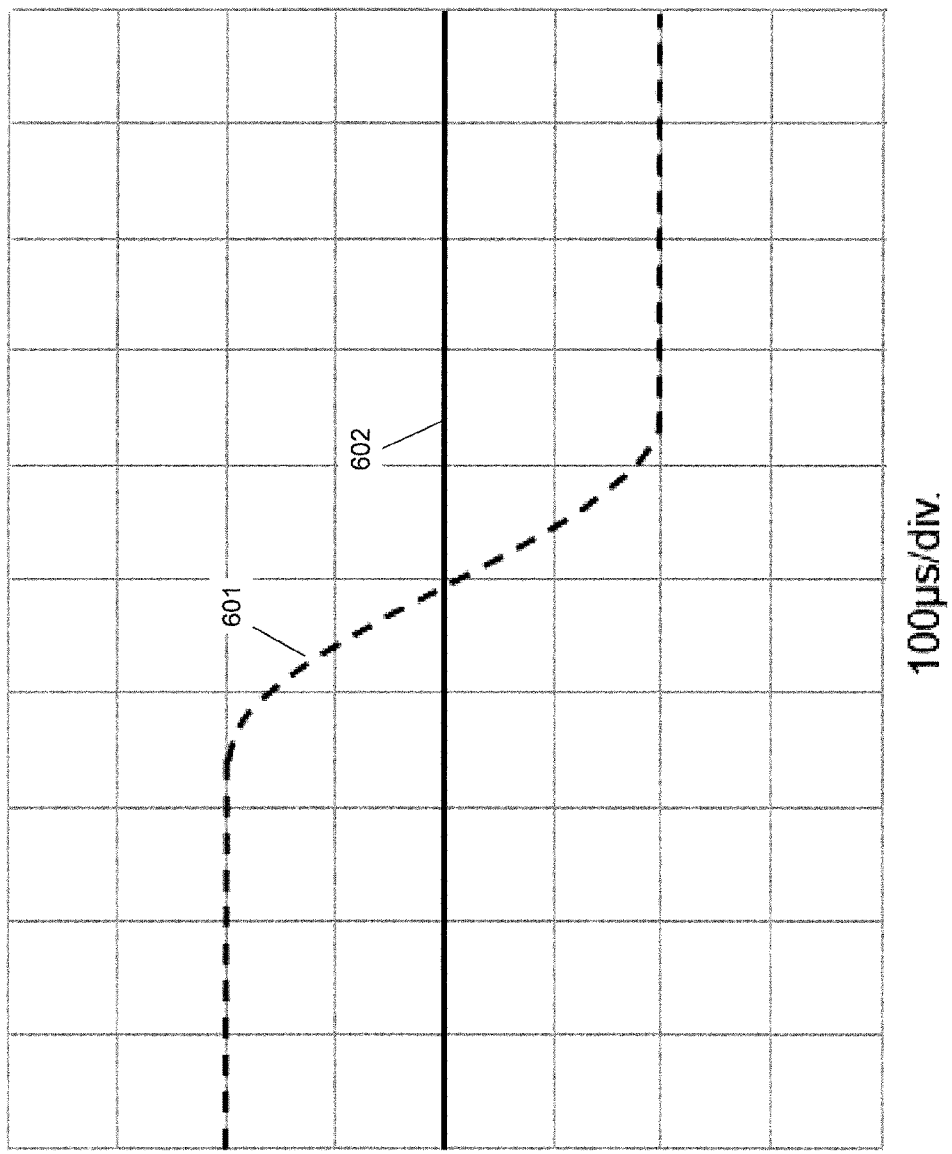
FIG. 8 shows an oscilloscope trace showing the output voltage 601 (dotted line) across a load capacitance and the current drawn from an HV power supply 602 (solid line) obtained using the "pre-charge energy recovery" circuit of FIG. 4.

A comparison of FIG. 7 and FIG. 8 illustrates the improvement obtained in the output voltage 501, 601 (dotted lines) and current drawn from an HV power supply 502, 602 (solid lines) using the "pre-charge energy recovery" circuit 300 of FIG. 4 (see FIG. 8) compared with the "hard switching" circuit 100 of FIG. 1 (see FIG. 7).

The improvement that can be obtained using the "pre-charge energy recovery" circuits described above in terms of reduction in current drawn from the HV supplies will in general be proportional to the magnitude of the load capacitance. In other words, the higher the load capacitance, the larger the benefit obtained.

The "pre-charge energy recovery" circuits described above may be used for any application that requires a load capacitance to be rapidly charged and discharged whilst minimising the impact on the power supplies used to provide the voltages between which the load capacitance is switched.

The "pre-charge energy recovery" circuits described above are particularly well suited for use in polarity switching power supplies for driving load capacitances and are thought to significantly outperform much larger supplies that use hard switching as currently used for this purpose.

Note that an existing polarity switching circuit could be retrofitted to provide a "pre-charge energy recovery" circuit as described herein. In this case, it might be assumed that a single "polarity" signal might exist as shown in the right-hand side of FIG. 4. It would then be a simple matter to derive all other switch commands from this one signal. For instance switch 302 could open at the negative going edge of the polarity signal and simultaneously switch 308a could close for a fixed duration set by the values of the load capacitance 306 and inductor, 310. When switch 308a opens, switch 304 could close and remain closed until the polarity signal changes back to POS at which point switch 308b could close for the same duration that 308a was closed earlier in the cycle. A negative going edge on the polarity signal could then begin the cycle again.

A voltage waveform generated by one of the circuits disclosed herein could be used to supply a radiofrequency (RF) or alternating current (AC) waveform, possibly for use in an apparatus for use in processing charged particles, e.g. for use in performing mass spectrometry. The voltage waveform generated could be described as largely rectangular in nature, although with sinusoidal, or resonant, switching edges. The frequency and amplitude of the waveform can be simply controlled by control of the power supplies connected to the voltage rails and by a control unit (not shown in the drawings), which may include digital control circuitry.

The circuits described above may be particularly well suited to employment in an apparatus for use in performing mass spectrometry, e.g. as discussed in the previous patent application by this applicant, EP2806553.

When used in this specification and claims, the terms "comprises" and "comprising", "including" and variations thereof mean that the specified features, steps or integers are included. The terms are not to be interpreted to exclude the possibility of other features, steps or integers being present.

The features disclosed in the foregoing description, or in the following claims, or in the accompanying drawings, expressed in their specific forms or in terms of a means for performing the disclosed function, or a method or process for obtaining the disclosed results, as appropriate, may, separately, or in any combination of such features, be utilised for realising the invention in diverse forms thereof.

While the invention has been described in conjunction with the exemplary embodiments described above, many equivalent modifications and variations will be apparent to those skilled in the art when given this disclosure. Accordingly, the exemplary embodiments of the invention set forth above are considered to be illustrative and not limiting. Various changes to the described embodiments may be made without departing from the spirit and scope of the invention.

For the avoidance of any doubt, any theoretical explanations provided herein are provided for the purposes of improving the understanding of a reader. The inventors do not wish to be bound by any of these theoretical explanations.

All references referred to above are hereby incorporated by reference.

The invention claimed is:

1. A mass spectrometer for use in processing charged particles, the mass spectrometer including a circuit for generating a voltage waveform at an output node, the circuit including:
   a first voltage rail configured to be held at a first voltage, wherein the first voltage rail is connected to the output node via a first voltage rail switch;
   a second voltage rail configured to be held at a second voltage that is different from the first voltage, wherein the second voltage rail is connected to the output node via a second voltage rail switch;
   a first anchor node connected to the output node via an inductor and a first anchor node switch, wherein the first anchor node is configured to be held at a first anchor voltage;
   a second anchor node connected to the output node via the inductor and a second anchor node switch, wherein the second anchor node is configured to be held at a second anchor voltage, wherein the first anchor node is separate from the second anchor node;
   a load capacitance connected to the output node so that, in use the load capacitance receives the voltage waveform generated at the output node by the circuit; and
   a control unit configured to switch the circuit between:
      a first voltage outputting state in which the first voltage rail switch is closed and the second voltage rail switch is open such that the output node is clamped to the first voltage;
      a second voltage outputting producing state in which the second voltage rail switch is closed and the first voltage rail switch is open such that the output node is clamped to the second voltage;
   wherein the control unit is configured to switch the circuit from the first voltage outputting state to the second voltage outputting state by:
      opening the first voltage rail switch and closing the first anchor node switch that connects the output node via the inductor to the first anchor node held at the first anchor voltage so that, a resonant circuit is established between the inductor that connects the output node to the first anchor node and the load capacitance causing the voltage at the output node to swing towards the second voltage, wherein the first anchor voltage is configured to provide energy that assists the voltage at the output node in swinging towards the second voltage; and then
      opening the first anchor node switch and closing the second voltage rail switch;
   wherein the control unit is further configured to switch the circuit from the second voltage outputting state to the first voltage outputting state by:

opening the second voltage rail switch and closing the second anchor node switch that connects the output node via the inductor to the second anchor node held at the second anchor voltage so that, a resonant circuit is established between the inductor that connects the output node to the second anchor node and the load capacitance causing the voltage at the output node to swing towards the first voltage, wherein the second anchor voltage is configured to provide energy that assists the voltage at the output node in swinging towards the first voltage; and then opening the second anchor node switch and closing the first voltage rail switch;

wherein the first anchor voltage is chosen so that the voltage at the output node reaches a peak in the voltage swing caused by the established resonant circuit substantially at the second voltage, when the control circuit switches the circuit from the first voltage outputting state to the second voltage outputting state; and wherein the second anchor voltage is chosen so that the voltage at the output node reaches a peak in the voltage swing caused by the established resonant circuit substantially at the first voltage, when the control circuit switches the circuit from the second voltage outputting state to the first voltage outputting state;

wherein the first and second anchor voltages are between the first and second voltages, with the first anchor voltage being closer to the second voltage than the first voltage, and with the second anchor voltage being closer to the first voltage than the second voltage;

wherein the circuit further includes a bidirectional switch via which the first and second anchor nodes connect to the output node.

2. A mass spectrometer according to claim 1, wherein the circuit includes voltage rail sources configured to provide the first and second voltages, and anchor voltage sources configured to provide the first and second anchor voltages, wherein the anchor voltage sources are independent from the voltage rail sources.

3. A mass spectrometer according to claim 1, wherein both the first and second voltages have a magnitude that is at least 1000V with respect to a ground.

4. A mass spectrometer according to claim 1, wherein the circuit is a switching circuit for generating a switching voltage waveform that switches between the first voltage and the second voltage at a frequency that is between 1 Hz and 10 MHz.

5. A mass spectrometer according to claim 1, wherein the first voltage and second voltage have magnitudes that are substantially equal and opposite in polarity to each other with respect to a ground.

6. A mass spectrometer according to claim 1, wherein the inductor that connects the output node to the first anchor node and the inductor that connects the output node to the second anchor node are the same inductor.

7. A mass spectrometer according to claim 1,
wherein the control unit is further configured to close the bidirectional switch after closing the first anchor node switch and open the bidirectional switch before opening the first anchor node switch when switching the circuit from the first voltage outputting state to the second voltage outputting state, and wherein the control unit is further configured to close the bidirectional switch after closing the second anchor node switch and open the bidirectional switch before opening the second anchor node switch when switching the circuit from the second voltage outputting state to the first voltage outputting state.

8. A method of controlling a mass spectrometer for use in processing charged particles;

wherein the mass spectrometer includes a circuit for generating a voltage waveform at an output node, the circuit including:

a first voltage rail configured to be held at a first voltage, wherein the first voltage rail is connected to the output node via a first voltage rail switch;

a second voltage rail configured to be held at a second voltage that is different from the first voltage, wherein the second voltage rail is connected to the output node via a second voltage rail switch;

a first anchor node connected to the output node via an inductor and a first anchor node switch, wherein the first anchor node is configured to be held at a first anchor voltage;

a second anchor node connected to the output node via the inductor and a second anchor node switch, wherein the second anchor node is configured to be held at a second anchor voltage, wherein the first anchor node is separate from the second anchor node;

a load capacitance connected to the output node so that, in use the load capacitance receives the voltage waveform generated at the output node by the circuit;

a bidirectional switch via which the first and second anchor nodes connect to the output node;

wherein the method includes switching the circuit from the first voltage outputting state to the second voltage outputting state by:

opening the first voltage rail switch and closing the first anchor node switch that connects the output node via the inductor to the first anchor node held at the first anchor voltage so that, a resonant circuit is established between the inductor that connects the output node to the first anchor node and the load capacitance causing the voltage at the output node to swing towards the second voltage, wherein the first anchor voltage is configured to provide energy that assists the voltage at the output node in swinging towards the second voltage; and then opening the first anchor node switch and closing the second voltage rail switch; and switching the circuit from the second voltage outputting state to the first voltage outputting state by:

opening the second voltage rail switch and closing the second anchor node switch that connects the output node via the inductor to the second anchor node held at the second anchor voltage so that, a resonant circuit is established between the inductor that connects the output node to the second anchor node and the load capacitance causing the voltage at the output node to swing towards the first voltage, wherein the second anchor voltage is configured to provide energy that assists the voltage at the output node in swinging towards the first voltage; and then opening the second anchor node switch and closing the first voltage rail switch;

wherein the first anchor voltage is chosen so that the voltage at the output node reaches a peak in the voltage swing caused by the established resonant circuit substantially at the second voltage, when the control circuit switches the circuit from the first voltage outputting state to the second voltage outputting state; and wherein the second anchor voltage is chosen so that the voltage at the output node reaches a peak in the voltage swing caused by the established resonant circuit substantially at the first voltage, when the control circuit switches the circuit from the second voltage outputting state to the first voltage outputting state;

wherein the first and second anchor voltages are between the first and second voltages, with the first anchor voltage being closer to the second voltage than the first voltage, and with the second anchor voltage being closer to the first voltage than the second voltage.

\* \* \* \* \*